(12) United States Patent
Su et al.

(10) Patent No.: US 7,394,181 B2
(45) Date of Patent: Jul. 1, 2008

(54) HYBRID ELETROMECHANICAL ACTUATOR AND ACTUATION SYSTEM

(75) Inventors: Ji Su, Yorktown, VA (US); Tian-Bing Xu, Hampton, VA (US)

(73) Assignee: United States of America as represented by the Administrator of the National Aeronautics and Space Administration, Washington, DC (US)

( * ) Notice: Subject to any disclaimer, the term of this patent is extended or adjusted under 35 U.S.C. 154(b) by 326 days.

(21) Appl. No.: 11/076,824

(22) Filed: Mar. 4, 2005

(65) Prior Publication Data

US 2006/0197405 A1 Sep. 7, 2006

(51) Int. Cl.
*H01L 41/04* (2006.01)
(52) U.S. Cl. ............. 310/328; 310/330; 310/331; 310/332; 310/324; 310/800
(58) Field of Classification Search ......... 310/330–332, 310/324, 328, 800
See application file for complete search history.

(56) References Cited

U.S. PATENT DOCUMENTS

| | | | | |
|---|---|---|---|---|
| 4,140,936 A | * | 2/1979 | Bullock | 310/328 |
| 4,237,399 A | * | 12/1980 | Sakamoto | 310/332 |
| 4,999,819 A | | 3/1991 | Newnham et al. | |
| 5,276,657 A | | 1/1994 | Newnham et al. | |
| 6,671,131 B2 | * | 12/2003 | Kasajima et al. | 360/294.4 |

OTHER PUBLICATIONS

Cross, Eric L., "Ferroelectric Ceramics: Materials and Application Issues," Hybrid Microelectronic Materials, pp. 15-55, date not provided.
Newnham, R.E., "Composite Elecroceramics," Ann. Rev. Mater. Sci, 1986. 16: pp. 47-68.
Cheng, Zhoneyang, Xu, Tian-Bing, Zhang, Qiming, Meyer, Jr., Richard, Van Tol, David, and Hughes, Jack, "Design, Fabrication, and Performance of a Flextensional Transducer Based on Electrostrictive Polyvinylidene Fluoride-Trifluoroethylene Copolymer," IEEE vol. 49, No. 9 Sep. 2002, pp. 1312-1320.
Pelrine, Ronald E., Kornbluh, Roy D., and Joseph, Jose P., "Electrostriction of Polymer Dielectrics with Complaint Electrodes as a Means of Actuation," Elsevier, A 64, 1998, pp. 77-85.
Xu, T.B., Cheng, Z.Y., Zhang, Q.M., "High-Performance Micromachined Unimorph Actuators Based on Electrostrictive Poly(Vinylidene Fluoride-Trifluoroethylene) Copolymer," American Institute of Physics, vol. 80, No. 6, pp. 1082-1084. Feb. 11, 2002.
Su, J, Harrison, J.S., St. Clair, T.L., Bar-Cohen, Y., and Leary, S., "Electrostrictive Graft Elastomers and Applications," Proceedings of MRS Fall Meeting, 600, 131, 1999, pp. 1-6.

* cited by examiner

*Primary Examiner*—Jaydi A San Martin
(74) *Attorney, Agent, or Firm*—Robin W. Edwards

(57) ABSTRACT

A hybrid electromechanical actuator has two different types of electromechanical elements, one that expands in a transverse direction when electric power is applied thereto and one that contracts in a transverse direction when electric power is applied thereto. The two electromechanical elements are (i) disposed in relation to one another such that the transverse directions thereof are parallel to one another, and (ii) mechanically coupled to one another at least at two opposing edges thereof. Electric power is applied simultaneously to the elements.

28 Claims, 4 Drawing Sheets

HYBRID ELETROMECHANICAL ACTUATOR AND ACTUATION SYSTEM

ORIGIN OF THE INVENTION

The invention described herein was made in part by an employee of the United States Government and may be manufactured and used by and for the Government of the United States for governmental purposes without the payment of any royalties thereon or therefore.

BACKGROUND OF THE INVENTION

1. Field of the Invention

This invention relates to electromechanical actuators. More specifically, the invention is a hybrid electromechanical actuator and actuation system in which two different types of electromechanical elements are coupled together.

2. Description of the Related Art

Electromechanical devices made from electroactive materials are widely used in a variety of technologies to include precision mechanical systems, optical devices, drug delivery systems, underwater navigation systems, microphones, and aerospace applications (e.g., active noise vibration control, aerodynamic control and surveillance). Electroactive materials, to include electroactive polymers, ceramics and composites, have been developed for use in such electromechanical devices. The two key issues that arise in the development of an electromechanical device using one of these materials are (i) performance enhancement in terms of electric-field induced mechanical motion and power, and (ii) reduction in the energy required to drive the device. Currently, research has focused on the development of an electroactive material that offers the desired electromechanical properties for the particular application and/or reduces the power consumption of the material for the particular application.

SUMMARY OF THE INVENTION

Accordingly, it is an object of the present invention to provide an electromechanical actuator that offers improved electromechanical performance while also providing improved power consumption efficiency.

Another object of the present invention is to provide a high performance, high efficiency electromechanical actuation system.

Other objects and advantages of the present invention will become more obvious hereinafter in the specification and drawings.

In accordance with the present invention, a hybrid electromechanical actuator and actuation system utilize two different types of electromechanical elements. A first electromechanical element includes a first electromechanically active component that expands in a transverse direction when electric power is applied thereto. A second electromechanical element includes a second electromechanically active component that contracts in a transverse direction when electric power is applied thereto. The first and second electromechanical elements are (i) disposed in relation to one another such that the transverse directions thereof are parallel to one another, and (ii) mechanically coupled to one another at least at two opposing edges thereof. To complete the actuation system, an electric power source is coupled to the first and second electromechanically active components and simultaneously applies electric power thereto.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
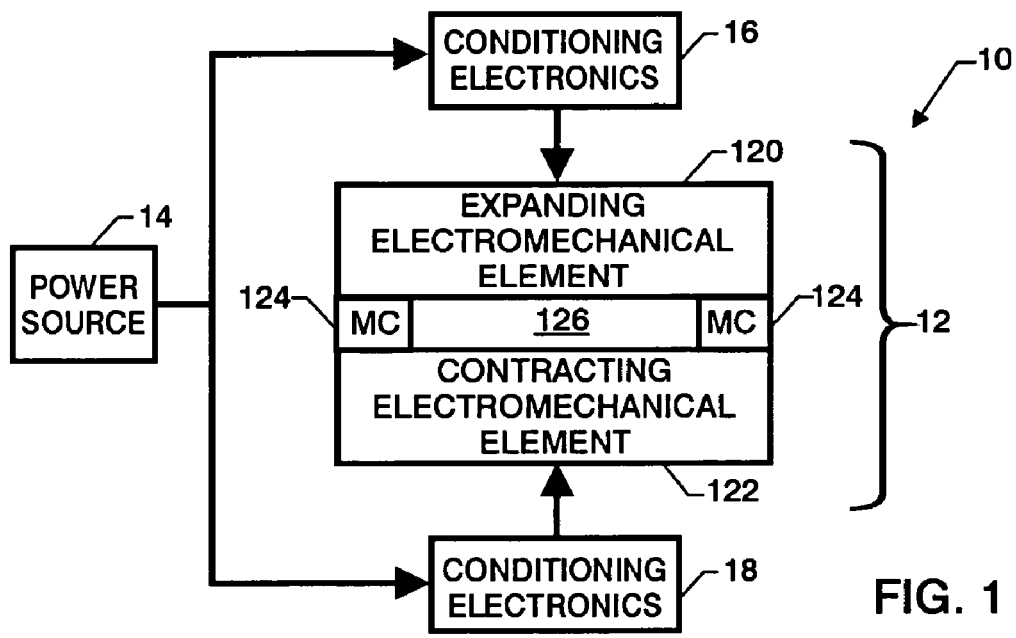
FIG. 1 is a block diagram of a one-direction electromechanical actuation system in accordance with the present invention.

Referring now to the drawings, and more particularly to FIG. 1, a one-direction electromechanical actuation system is shown and is referenced generally by numeral 10. System 10 is illustrated generally and will be used to describe the novelty and operating principles of the present invention. However, it is to be understood that the particular size, shape, construction details, and application of an actual actuation system can be varied without departing from the scope of the present invention. For example, the actuation system can be designed in various shapes, including but not limited to rectangular, circular, square, and oval.

Electromechanical actuation system 10 utilizes a hybrid electromechanical actuator 12 constructed from two different types of electromechanical elements. In general, the two different types of electromechanical elements cooperate to generate mechanical motion and power that exceeds that of either of the individual elements when the elements (in the hybrid actuator, configuration) have electric power simultaneously applied thereto.

Hybrid actuator 12 mechanically couples an expanding electromechanical element (EEE) 120 and a contracting electromechanical element (CEE) 122 using mechanical couplings ("MC") 124. A single power source 14 is used to simultaneously apply electric power to each of elements 120 and 122. Depending on the configuration/construction of elements 120 and 122 and/or application of system 10, the same or different levels of electric power can be applied to elements 120 and 122. The requisite levels of electric power can be regulated by conditioning electronics 16 and 18 respectively coupled between power source 14 and elements 120 and 122.

Figure 2A:
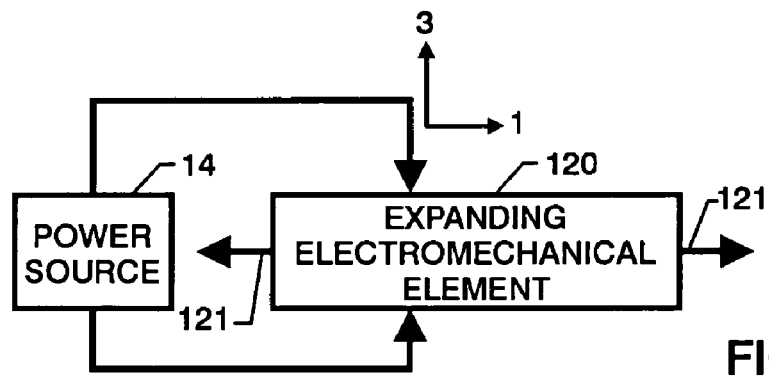
FIG. 2A is a schematic view of the expanding electromechanical element shown in isolation illustrating an electric field in direction 3 that brings about expansion in the transverse direction 1.
Figure 2B:
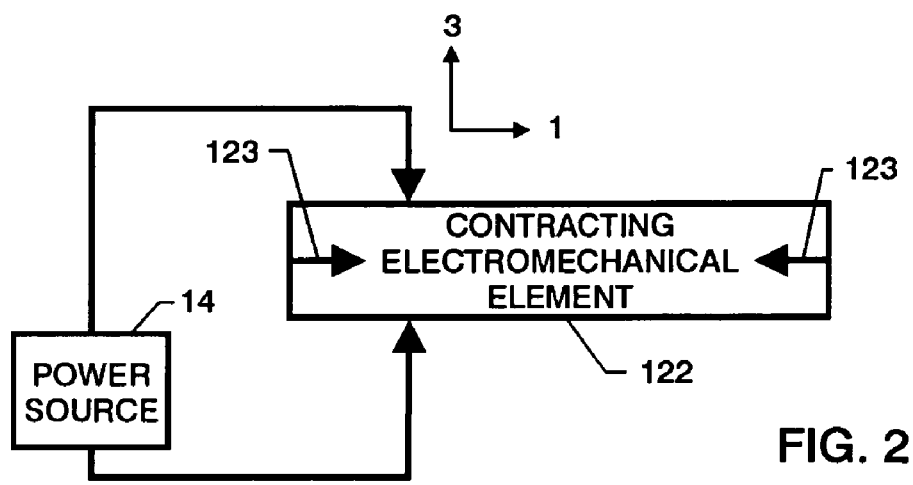
FIG. 2B is a schematic view of the contracting electromechanical element shown in isolation illustrating an electric field in direction 3 that brings about contraction in the transverse direction 1.

The operating principles of the present invention will now be explained with reference to FIGS. 2A, 2B and 3. In FIG. 2A, when electric power is applied to EEE 120 such that the electric field developed therein is along direction 3, EEE 120 experiences expansion in what is known as the transverse direction (i.e., direction 1) as indicated by arrows 121. Conversely, in FIG. 2B, when electric power is applied to CEE 122 such that the electric field developed therein is along direction 3, CEE 122 experiences contraction in the transverse direction (i.e., direction 1) as indicated by arrows 123. The present invention utilizes the opposing transverse-direction expansion and contraction reactions. Specifically, EEE 120 and CEE 122 are mechanically coupled to each other at opposing edges thereof using mechanical couplings 124 such that the transverse directions of each element are parallel with one another and such that there is an unbound region 126 between elements 120 and 122. Unbound region 126 can be realized by either an unbound interface/contact between elements 12 and 122 or a physical gap between elements 120 and 122 except for,the locations of mechanical couplings 124. As a result of this construction, when electric power is applied simultaneously to EEE 120 and CEE 122 (as part of system 10), EEE 120 expands (illustrated by arrows 121) while CEE 122 contracts (illustrated by arrows 123) to generate enhanced displacement (FIG. 3) in the direction perpendicular to the parallel transverse directions of the elements.

Figure 4:
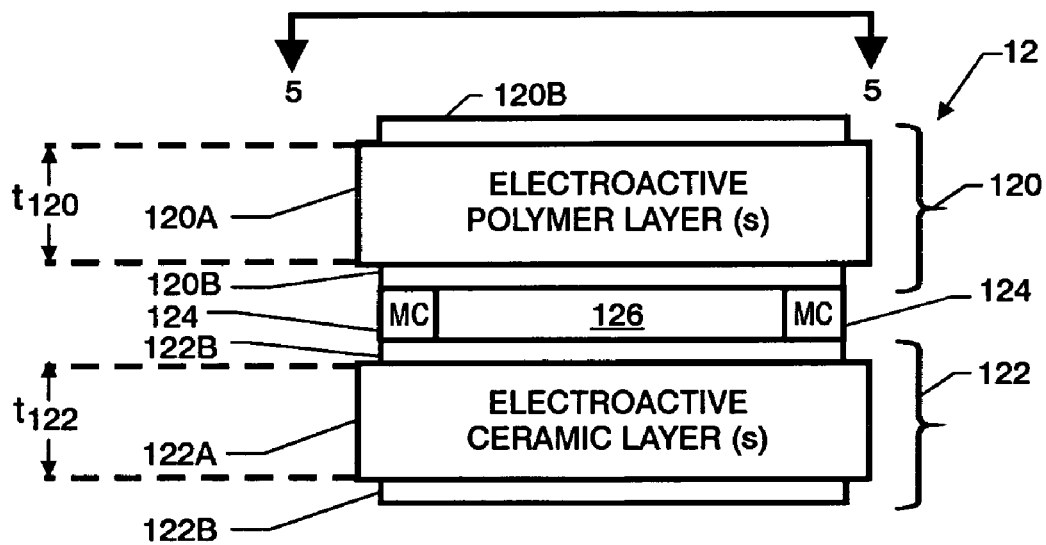
FIG. 4 is a side view of an embodiment of a one-direction electromechanical element in accordance with the present invention.
Figure 5:
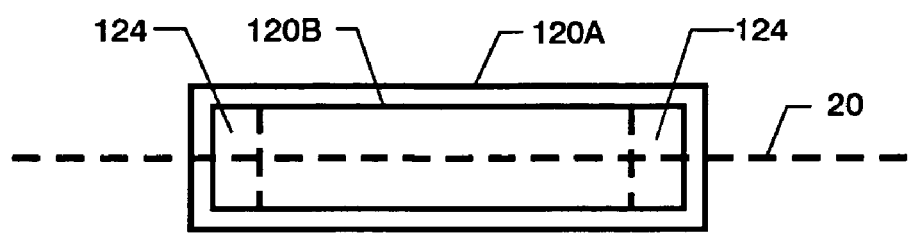
FIG. 5 is a plan view of the element taken along line 5-5 in FIG. 4.

To generate the requisite expansion or contraction, each of elements 120 and 122 utilizes an electromechanically active component. By way of example, one possible construction of hybrid actuator 12 in FIG. 1 is shown in FIGS. 4 and 5 where EEE 120 and CEE 122 are mechanically-coupled at their opposing edges by couplings 124. Such mechanical coupling can be accomplished using adhesive or any other bonding technique known in the art.

EEE 120 can be made from one or more layers 120A of electroactive polymers having electrodes 120B disposed on opposing planar surfaces thereof. Layer(s) 120A define a thickness $t_{120}$ that can be optimized to provide a specific electromechanical contribution (i.e., expansion) for a specific voltage V applied thereto since the electric field E developed across thickness $t_{120}$ is equal to $V/t_{120}$. The opposing planar surfaces of layer(s) 120A define the transverse direction of layer(s) 120A. Typically, electrodes 120B are slightly smaller in size than the planar surface are of layer(s) 120A in order to avoid the build up of space charges as would be well understood in the art. The electroactive polymers can be piezoelectric polymers or electrostrictive polymers. Suitable piezoelectric polymers include-but are not limited to poly (vinylidene fluoride) (PVDF or $PVDF_2$), poly(vinylidene fluoride-trifluoroethylene) copolymers, piezoelectric nylons, and other piezoelectric polymers, copolymers and polymeric composites. Suitable electrostrictive polymers include but are not limited to irradiated PVDF or $PVDF_2$ poly(vinylidene fluoride-trifluoroethylene)copolymers, polyurethane elastomers, dielectric elastomers, dielectrostrictive elastomers, graft elastomers, terpolymers, and other polymers and polymeric composites.

CEE 122 can be made from one or more layers 122A of electroactive ceramics having electrodes 122B disposed on opposing planar surfaces thereof where these surfaces define the transverse direction of layer(s) 122A. Layer(s) 122A define a thickness $t_{122}$ that can be optimized to provide a specific electromechanical contribution (i.e., contraction) for a specific voltage V applied thereto since the electric field E developed across thickness $t_{122}$ is equal to $V/t_{122}$.

The electroactive ceramics for layer(s) 122A can include but are not limited to lead zirconate titanate (PZT), barium titanate ceramics, single-crystal barium, lead magnesium niobate-lead titanate ceramics (PMN-xPT), single-crystal lead-zinc, single-crystal niobate-lead titanate, lead zinc niobate-lead magnesium niobate-lead titanate ceramics (PZN-PMN-PT), lead lanthanum zirconate titanate (PLZT), strontium barium niobate crystal, lithium niobate crystal, lithium tantalate, lead barium niobate crystal, and other electroactive ceramics that contract in a transverse direction thereof in the presence of an electric field.

The above-described piezoelectric/electrostrictive polymers and electroactive ceramics expand and contract, respectively, isotropically in their transverse planes. Accordingly, it may be desirable to direct the expansion/contraction primarily along one direction/dimension by appropriately sizing/shaping the components of the hybrid actuator. For example, as illustrated in the plan view of FIG. 5, the shapes of layer(s) 120A and electrodes 120B (as well as the shapes of layer(s) 122A and electrodes 122B which are not visible in FIG. 5) are elongated and aligned with one another. In this way, expansion of layer(s) 120A (and simultaneous contraction of layer (s) 122A) will occur primarily along the axis 20 of the elongate shape. This is because the dimension of the hybrid actuator's elements, while in the transverse plane of each of layer(s) 120A and 122A, are substantially less in the direction that is perpendicular to axis 20. Thus, in general, the shape (i.e., the transverse plane) of layer(s) 120A/122A and electrodes 120B/122B can be tailored to define respective primary directions of expansion and contraction. Mechanical motion in the present invention is maximized when (i) the primary directions of expansion and contraction are aligned with one another, and (ii) the individual electromechanical elements are mechanically coupled to one another at opposing edges that are along the aligned primary directions of expansion and contraction.

Figure 3:
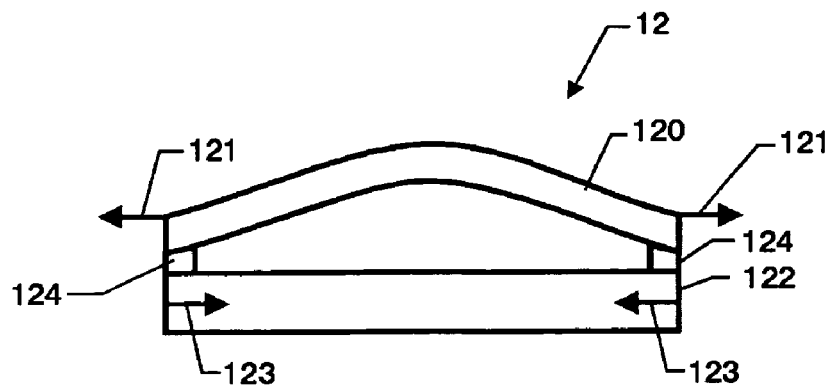
FIG. 3 is a schematic view of the actuation response of the one-direction system shown in FIG. 1.
Figure 6:
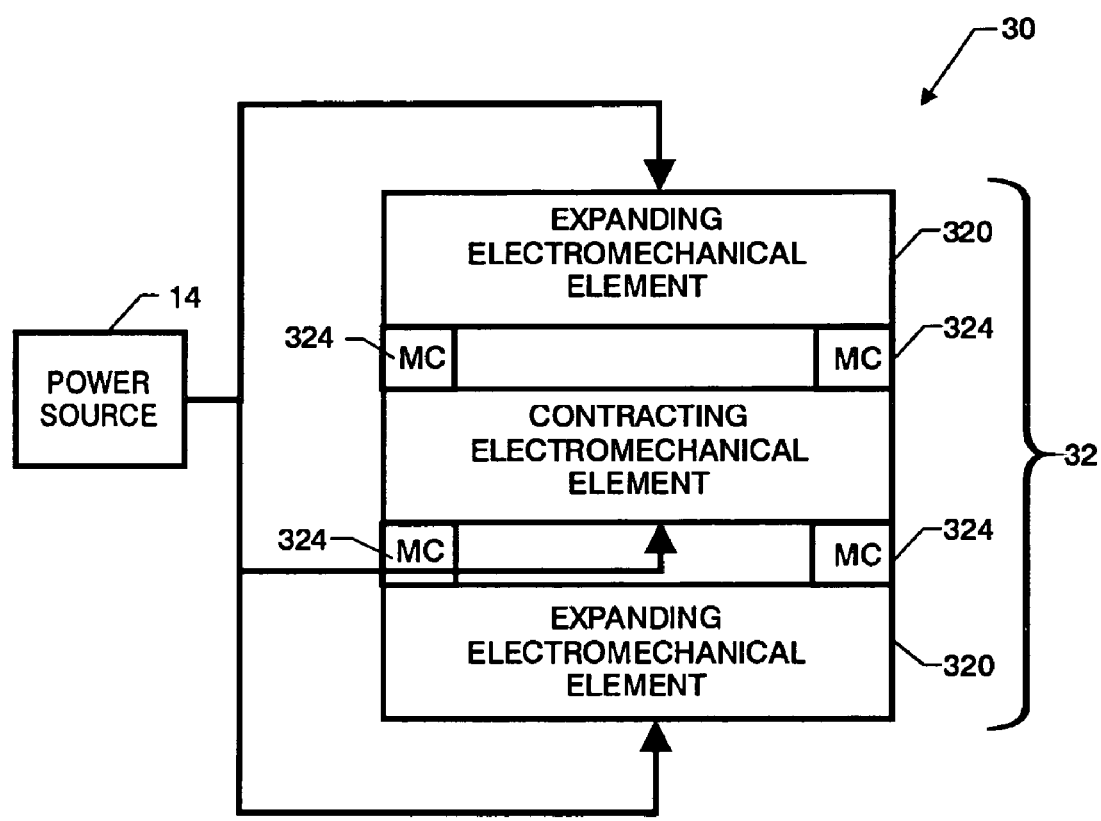
FIG. 6 is a block diagram of a two-direction electromechanical actuation system in accordance with the present invention.

For the above-described hybrid actuator and actuation system, displacement occurs in a single direction, e.g., up as illustrated in FIG. 3. However, the present invention is not so limited. For example, a two-direction actuation system 30 and its hybrid actuator 32 illustrated in FIGS. 6 and 7, respectively, are capable of simultaneously generating both up and down mechanical motion. Hybrid actuator 32 consists of two expanding electromechanical elements (EEE) 320 sandwiched about and mechanically coupled (via mechanical coupling 324) to contracting electromechanical element (CEE) 322. As in the one-direction embodiment, EEE's 320 and CEE 322 will have electric power applied thereto simultaneously by power source 14. Although not shown, power conditioning electronics could be provided for each individual electromechanical element of hybrid actuator 32.

Figure 7:
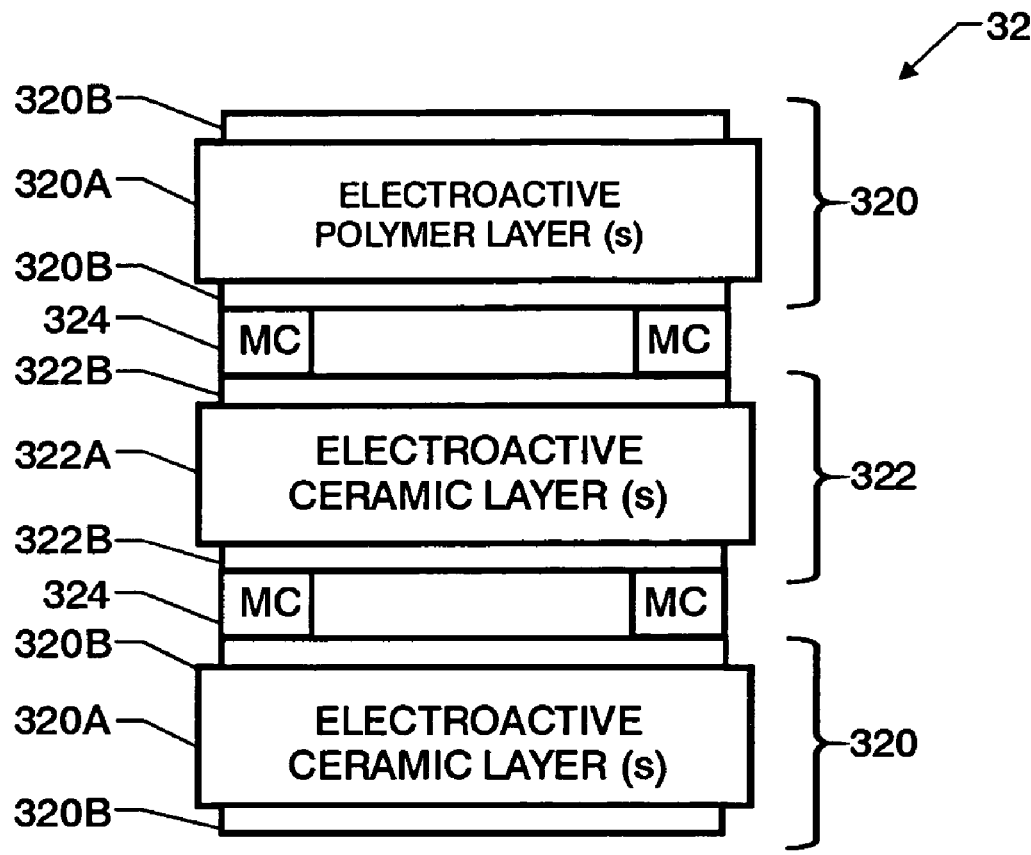
FIG. 7 is a side view of an embodiment of a two-direction electromechanical element in accordance with the present invention.
Figure 8:
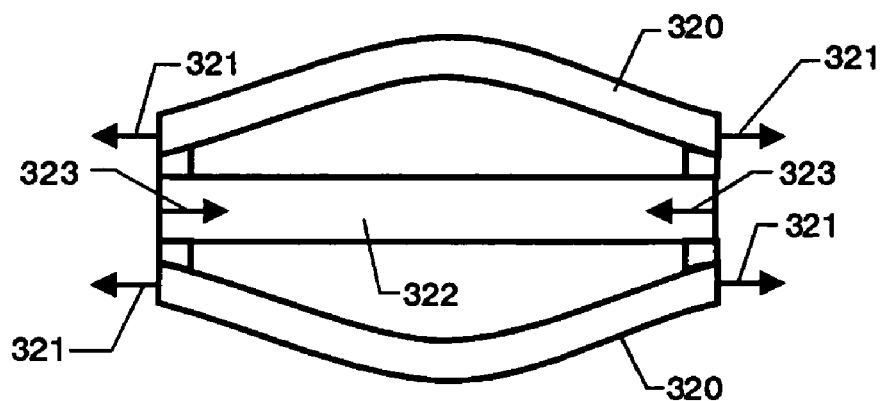
FIG. 8 is a schematic view of the actuation response of the one-direction system shown in FIG. 6.

As shown in FIG. 7, each of elements 320 and 322 consists of an appropriate electromechanically active component (e.g., layer(s) 320A of piezoelectric or electrostrictive polymers and layer(s) 322A of electroactive ceramics) with electrodes (i.e., electrodes 320B and 322B) disposed on opposing planar surfaces of the mechanically active component. Hybrid actuator 32 is constructed such that the transverse directions of each of elements 320 and 322 are parallel to one another. Thus, when electric power is simultaneously applied to (i) both of elements 320, and (ii) element 322, both sets of layer(s) 320A expand while layer(s) 322A contract. Through proper construction techniques and power application, hybrid actuator 32 generates enhanced displacement in opposing (e.g., up and down in the illustrated example) directions perpendicular to the parallel transverse directions of each electromechanical element. This is illustrated in FIG. 8 where arrows 321 indicate expansion in the transverse direction and arrows 323 indicate contraction in the transverse direction.

Similar to the one-direction actuation system, mechanical motion and displacement in two directions is maximized by (i) aligning the primary directions of expansion and contraction, and (ii) mechanically coupling the individual electromechanical elements (i.e, elements 320 and 322) to one another at opposing edges thereof that are along the aligned primary directions of expansion and contraction.

The advantages of the present invention are numerous. The electroactive hybrid actuator and actuation system demonstrate a novel approach for utilizing the electromechanical properties of electroactive polymers and electroactive ceramics to achieve significantly enhanced electromechanical performance. Electromechanical performance is superior to that of devices using each component individually. The-hybrid actuator can be used by itself or could serve as the building block for electromechanical arrays, stack actuation systems, etc.

As mentioned above, the electric field developed in an electromechanical element is a function of the active component(s) thickness (i.e., E=V/t where E is the electric field, V is the voltage applied to the electromechanical element, and t is the thickness of the element's active component(s)). Thus, the hybrid actuator's performance can be optimized by adjusting the relative thickness of each electroactive component, adjusting the power distribution to each electroactive component, or adjusting both the relative thickness and power distribution to optimize the performance and efficiency. In this way, the electromechanical contribution of each element can be tailored to exacting requirements. Since a wide variety of electroactive components can be used by the present invention, each hybrid actuator can be designed to exacting standards for a particular purpose.

Although the invention has been described relative to a specific embodiment thereof, there-are numerous variations and modifications that will be readily apparent to those skilled in the art in light of the above teachings. For example, rather than just mechanically coupling the individual electromechanical elements to one another at two opposing edges, the present invention could be realized by mechanically coupling two individual electromechanical elements at a variety of points distributed at the peripheral edges thereof or continuously about the peripheral edges thereof. It is therefore to be understood that, within the scope of the appended claims, the invention may be practiced other than as specifically described.

What is claimed as new and desired to be secured by Letters Patent of the United States is:

1. An electromechanical actuation system, comprising:
    a first electromechanical clement including a first electromechanically active component that expands in a transverse direction when electric power is applied thereto;
    a second electromechanical element including a second electromechanically active component, that contracts in a transverse direction when electric power is applied thereto, said first and second electromechanical elements being (i) disposed in relation to one another such that said transverse directions thereof are parallel to one another, and (ii) mechanically coupled to one another at least at two opposing edges thereof;
    wherein said first and second electromechanically active components will displace in opposing directions simultaneously upon application of the same electrical power; and
    an electric power source coupled to said first and second electromechanically active components for simultaneously applying electric power thereto.

2. An electromechanical actuation system as in claim 1 wherein said first electromechanically active component comprises at least one layer of an electroactive polymer.

3. An electromechanical actuation system as in claim 2 wherein said electroactive polymer is selected from the group consisting of piezoelectric polymers and electrostrictive polymers.

4. An electromechanical actuation system as in claim 1 wherein said second electromechanically active component comprises at least one layer of an electroactive ceramic.

5. An electromechanical actuation system as in claim 1 further comprising a third electromechanical element including a third electromechanically active component that expands in a transverse direction when electric power is applied thereto, said third electromechanical element being (i) disposed in relation to said first and second electromechanical elements such that said transverse directions thereof are parallel to one another, and (ii) mechanically coupled to said second electromechanical element at least at two opposing edges thereof that are aligned with said two opposing edges of said first and second electromechanical elements wherein said second electromechanical element is sandwiched between said first and third electromechanical elements, said electric power source further coupled to said third electromechanically active component for simultaneously applying electric power to said first, second and third electromechanically active components.

6. An electromechanical actuation system as in claim 1 wherein said first electromechanically active component is defined by a first thickness extending perpendicular to said transverse direction of said first electromechanical element and wherein said second electromechanically active component is defined by a second thickness extending perpendicular to said transverse direction of said second electromechanical element, said first thickness governing expansion of said first electromechanical element for a given level of electric power applied thereto, and said second thickness governing contraction of said second electromechanical element for a given level of electric power applied thereto.

7. An electromechanical actuation system as in claim 1 having a shape selected from the group consisting of rectangular, circular, square, oval, and variations thereof.

8. An electromechanical actuator, comprising:
    a first electromechanical element including a first electromechanically active component that expands in a transverse direction when electric power is applied thereto; and
    a second electromechanical element including a second electromechanically active component that contracts in a transverse direction when electric power is applied thereto, said first and second electromechanical elements being (i) disposed in relation to one another such that said transverse directions thereof are parallel to one another, and (ii) mechanically coupled to one another at least at two opposing edges thereof;
    wherein said first and second electromechanically active components will displace in opposing directions simultaneously upon application of the same electrical power.

9. An electromechanical actuator as in claim 8 wherein said first electromechanically active component comprises at least one layer of an electroactive polymer.

10. An electromechanical actuator as in claim 9 wherein said electroactive polymer is selected from the group consisting of piezoelectric polymers and electrostrictive polymers.

11. An electromechanical actuator as in claim 8 wherein said second electromechanically active component comprises at least one layer of an electroactive ceramic.

12. An electromechanical actuator as in claim 8 further comprising a third electromechanical element including a third electromechanically active component that expands in a transverse direction when electric power is applied thereto, said third electromechanical element being (i) disposed in relation to said first and second electromechanical elements such that said transverse directions thereof are parallel to one another, and (ii) mechanically coupled to said second electromechanical element at least at two opposing edges thereof that are aligned with said two opposing edges of said first and second electromechanical elements wherein said second electromechanical element is sandwiched between said first and third electromechanical elements.

13. An electromechanical actuator as in claim 8 wherein said first electromechanically active component is defined by a first thickness extending perpendicular to said transverse direction of said first electromechanical element and wherein said second electromechanically active component is defined by a second thickness extending perpendicular to said transverse direction of said second electromechanical element, said first thickness governing expansion of said first electromechanical element for a given level of electric power applied thereto, and said second thickness governing contraction of said second electromechanical element for a given level of electric power applied thereto.

14. An electromechanical actuator as in claim 8 having a shape selected from the group consisting of rectangular, circular, square, oval, and variations thereof.

15. An electromechanical actuation system, comprising:
   a first electromechanical element having (i) a first electromechanically active component capable of isotropic expansion in a transverse plane thereof when electric power is applied thereto, and (ii) first electrodes coupled to said first electromechanically active component for defining a primary direction of expansion in said transverse plane thereof when electric power is applied to said first electrodes;
   a second electromechanical element having (i) a second electromechanically active component capable of isotropic contraction in a transverse plane thereof when electric power is applied thereto, and (ii) second electrodes coupled to said second electromechanically active component for defining a primary direction of contraction in said transverse plane thereof when electric power is applied to said second electrodes, said first and second electromechanical elements being (i) disposed in relation to one another such that said transverse planes thereof are parallel to one another with said primary direction of expansion being aligned with said primary direction of contraction, and (ii) mechanically coupled to one another at least at two opposing edges thereof along said primary direction of expansion and said primary direction of contraction;
   wherein said first and second electromechanically active components will displace in opposing directions simultaneously upon application of the same electrical power; and
   an electric power source coupled to said first and second electrodes for simultaneously applying electric power thereto.

16. An electromechanical actuation system as in claim 15 wherein said first electromechanically active component comprises at least one layer of an electroactive polymer.

17. An electromechanical actuation system as in claim 16 wherein said electroactive polymer is selected from the group consisting of piezoelectric polymers and electrostrictive polymers.

18. An electromechanical actuation system as in claim 15 wherein said second electromechanically active component comprises at least one layer of an electroactive ceramic.

19. An electromechanical actuation system as in claim 15 further comprising a third electromechanical element having (i) a third electromechanically active component capable of isotropic expansion in a transverse plane thereof when electric power is applied thereto, and (ii) third electrodes coupled to said third electromechanically active component for defining a primary direction of expansion in said transverse plane thereof when electric power is applied to said third electrodes, said third electromechanical element being (i) disposed in relation to said first and second electromechanical elements such that said transverse planes thereof are parallel to one another with each of said primary directions of expansion being aligned with said primary direction of contraction, and (ii) mechanically coupled to said second electromechanical element at least at two opposing edges thereof that are aligned with said two opposing edges of said first and second electromechanical elements wherein said second electromechanical element is sandwiched between said first and third electromechanical elements, said electric power source further coupled to said third electrodes for simultaneously applying electric power to said first, second and third electrodes.

20. An electromechanical actuation system as in claim 15 wherein said first electromechanically active component is defined by a first thickness extending perpendicular to said transverse direction of said first electromechanical element, and wherein said second electromechanically active component is defined by a second thickness extending perpendicular to said transverse direction of said second electromechanical element, said first thickness governing expansion of said first electromechanical element for a given level of electric power applied thereto, and said second thickness governing contraction of said second electromechanical element for a given level of electric power applied thereto.

21. An electromechanical actuation system as in claim 15 having a shape selected from the group consisting of rectangular, circular, square, oval, and variations thereof.

22. An electromechanical actuator, comprising:
   a first electromechanical element having (i) a first electromechanically active component capable of isotropic expansion in a transverse plane thereof when electric power is applied thereto, and (ii) first electrodes coupled to said first electromechanically active component for defining a primary direction of expansion in said transverse plane thereof when electric power is applied to said first electrodes; and
   a second electromechanical element having (i) a second electromechanically active component capable of isotropic contraction in a transverse plane thereof when electric power is applied thereto, and (ii) second electrodes coupled to said second electromechanically active component for defining a primary direction of contraction in said transverse plane thereof when electric power is applied to said second electrodes, said first and second electromechanical elements being (i) disposed in relation to one another such that said transverse planes thereof are parallel to one another with said primary direction of expansion being aligned with said primary direction of contraction, and (ii) mechanically coupled to one another at least at two opposing edges thereof along said primary direction of expansion and said primary direction of contraction;

wherein said first and second electromechanically active components will displace in opposing directions simultaneously upon application of the same electrical power.

23. An electromechanical actuator as in claim 22 wherein said first electromechanically active component comprises at least one layer of an electroactive polymer.

24. An electromechanical actuator as in claim 23 wherein said electroactive polymer is selected from the group consisting of piezoelectric polymers and electrostrictive polymers.

25. An electromechanical actuator as in claim 22 wherein said second electromechanically active component comprises at least one layer of an electroactive ceramic.

26. An electromechanical actuator as in claim 22 further comprising a third electromechanical element having (i) a third electromechanically active component capable of isotropic expansion in a transverse plane thereof when electric power is applied thereto, and (ii) third electrodes coupled to said third electromechanically active component for defining a primary direction of expansion in said transverse plane thereof when electric power is applied to said third electrodes, said third electromechanical element being (i) disposed in relation to said first and second electromechanical elements such that said transverse planes thereof are parallel to one another with each of said primary directions of expansion being aligned with said primary direction of contraction, and (ii) mechanically coupled to said second electromechanical element at least at two opposing edges thereof that are aligned with said two opposing edges of said first and second electromechanical elements wherein said second electromechanical element is sandwiched between said first and third electromechanical elements.

27. In electromechanical actuator as in claim 22 wherein said first electromechanically active component is defined by a first thickness extending perpendicular to said transverse direction of said first electromechanical element, and wherein said second electromechanically active component is defined by a second thickness extending perpendicular to said transverse direction of said second electromechanical element, said first thickness governing expansion of said first electromechanical element for a given level of electric power applied thereto, and said second thickness governing contraction of said second electromechanical element for a given level of electric power applied thereto.

28. An electromechanical actuator as in claim 22 having a shape selected from the group consisting of rectangular, circular, square, oval, and variations thereof.

* * * * *

UNITED STATES PATENT AND TRADEMARK OFFICE
CERTIFICATE OF CORRECTION

PATENT NO. : 7,394,181 B2
APPLICATION NO. : 11/076824
DATED : July 1, 2008
INVENTOR(S) : Su et al.

It is certified that error appears in the above-identified patent and that said Letters Patent is hereby corrected as shown below:

In the Drawings, Figure 7, replace "ELECTROACTIVE CERAMIC LAYER(s)" in the lower element 320A of FIG. 7 with "ELECTROACTIVE POLYMER LAYER(s)".

Signed and Sealed this
Twenty-ninth Day of May, 2012

David J. Kappos
*Director of the United States Patent and Trademark Office*